US009384980B2

(12) United States Patent
Yoshimizu et al.

(10) Patent No.: US 9,384,980 B2
(45) Date of Patent: Jul. 5, 2016

(54) MANUFACTURING METHOD OF SEMICONDUCTOR DEVICE

(71) Applicant: Kabushiki Kaisha Toshiba, Tokyo (JP)

(72) Inventors: Yasuhito Yoshimizu, Yokkaichi Mie (JP); Mitsuhiro Omura, Kuwana Mie (JP); Hisashi Okuchi, Yokkaichi Mie (JP); Satoshi Wakatsuki, Yokkaichi Mie (JP); Tsubasa Imamura, Kuwana Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/481,008

(22) Filed: Sep. 9, 2014

(65) Prior Publication Data

US 2016/0005604 A1 Jan. 7, 2016

Related U.S. Application Data

(60) Provisional application No. 62/019,608, filed on Jul. 1, 2014.

(51) Int. Cl.
*H01L 21/033* (2006.01)

(52) U.S. Cl.
CPC ........ *H01L 21/0338* (2013.01); *H01L 21/0332* (2013.01); *H01L 21/0335* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 6,232,227 B1 | 5/2001 | Mikagi | |
| 8,138,097 B1 | 3/2012 | Isobayashi et al. | |
| 2006/0003577 A1* | 1/2006 | Sone | H01L 21/76802 438/638 |
| 2006/0019485 A1* | 1/2006 | Komai | H01L 21/76811 438/627 |
| 2009/0206485 A1* | 8/2009 | Yang | H01L 21/02063 257/751 |
| 2011/0032772 A1* | 2/2011 | Aritome | H01L 27/11551 365/185.29 |
| 2012/0178241 A1* | 7/2012 | Malone | H01B 1/02 438/478 |
| 2013/0154087 A1 | 6/2013 | Yoshimizu et al. | |

FOREIGN PATENT DOCUMENTS

| | | |
|---|---|---|
| JP | 11-66654 | 3/1999 |
| JP | 2001-85397 | 3/2001 |
| JP | 2001-284288 | 10/2001 |
| JP | 2002-184752 | 6/2002 |
| JP | 2003-82469 | 3/2003 |
| JP | 2004-6790 | 1/2004 |
| JP | 2004-115839 | 4/2004 |
| JP | 3563809 | 6/2004 |
| JP | 2005-264256 | 9/2005 |

(Continued)

OTHER PUBLICATIONS

Lee_et_al (An English Machine translation of KR 101220652 B1).*

*Primary Examiner* — Khaja Ahmad
(74) *Attorney, Agent, or Firm* — Finnegan, Henderson, Farabow, Garrett & Dunner LLP

(57) ABSTRACT

According to an embodiment, a manufacturing method of a semiconductor device includes: forming a first film on a processing target by using a first material; forming a second film on the first film by using a second material; selectively removing the second and first films to provide an opening pierced in the second and first films; selectively forming a metal film on an inner surface of the opening in the first film; and processing the processing target by using the metal film as a mask.

10 Claims, 3 Drawing Sheets

OP
F3
F2
F1
100

M M
F2
F1
TR
100

(56) References Cited

FOREIGN PATENT DOCUMENTS

| | | | |
|---|---|---|---|
| JP | 2007-95999 | | 4/2007 |
| JP | 2007-266392 | | 10/2007 |
| JP | 2010-141178 | | 6/2010 |
| JP | 2011-54683 | | 3/2011 |
| JP | 2013-134798 | | 7/2013 |
| KR | 101220652 | B1 * | 1/2013 |

* cited by examiner

| PLATING CONDITIONS | | | PLATING GROWTH RESULTS (○: GROWN, ×: NOT GROWN) | | | |
|---|---|---|---|---|---|---|
| SAM TREATMENT | CATALYTIC TREATMENT | PLATING TREATMENT | $SiO_2$ | SiN | aSi | Carbon |
| NIL | $PdCl_2$ | $NiSO_4$ (WITH ADDITION OF B) | × | × | ○ | ○ |
| TMSDMA | $PdCl_2$ | $NiSO_4$ (WITH ADDITION OF B) | ○ | × | ○ | ○ |
| AMINOPROPYLTRIMETHOXYSILANE | $PdCl_2$ | $NiSO_4$ (WITH ADDITION OF B) | × | ○ | ○ | ○ |
| TMSDMA+AMINOPROPYLTRIMETHOXYSILANE | $PdCl_2$ | $NiSO_4$ (WITH ADDITION OF B) | × | ○ | ○ | ○ |

FIG. 2

MANUFACTURING METHOD OF SEMICONDUCTOR DEVICE

CROSS REFERENCE APPLICATIONS

This application is based upon and claims the benefit of U.S. provisional Application No. 62/019,608, filed on Jul. 1, 2014, the entire contents of which are incorporated herein by reference.

FIELD

Embodiments described herein relate generally to a manufacturing method of a semiconductor device.

BACKGROUND

To form a structure having high-aspect holes or grooves by using a pattern formed based on a lithography technology, a mask material having high etching resistance is required. Further, to transfer a resist pattern to a material having high etching resistance such as a metal, a technology for performing dry etching with respect to this material is important.

In the prior art, a physical etching effect or a corrosive gas is used for patterning a metal material having high dry etching resistance.

However, perpendicular processability is low in the physical etching, and forming a mask that enables formation of a high-aspect hole or groove structure is difficult. Further, for example, when a halogen gas is used, there occurs a problem that a metal material corrodes and processing residues remain to contaminate a processing target under the mask.

BRIEF DESCRIPTION OF THE DRAWINGS

In the accompanying drawings:

FIG. 2 is an example of a view for explaining a relationship between plating conditions and plating growth results.

DETAILED DESCRIPTION

Figure 1C:
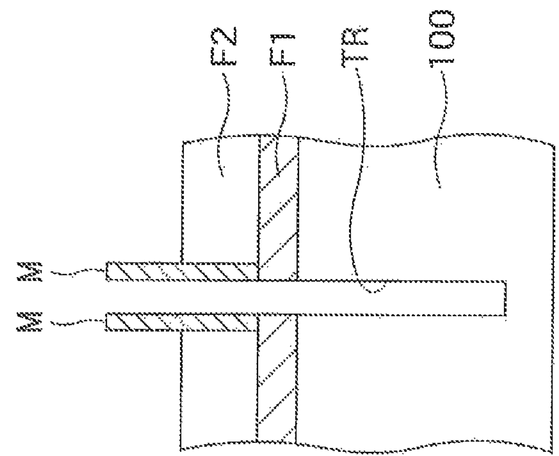
FIG. 1A to FIG. 1C are examples of schematic cross-sectional views for explaining a manufacturing method of a semiconductor device according to an embodiment.

According to an embodiment, a manufacturing method of a semiconductor device includes: forming a first film on a processing target by using a first material; forming a second film on the first film by using a second material; selectively removing the second and first films to provide an opening pierced in the second and first films; selectively forming a metal film on an inner surface of the opening in the first film; and processing the processing target by using the metal film as a mask.

Embodiments will now be described hereinafter with reference to the drawings. In the drawings, like reference numerals denote like parts to appropriately omit an overlapping description thereof.

Each of the accompanying drawings is used for promoting an explanation and an understanding of the present invention, and it is to be noted that shapes, dimensions, ratios, and others in the respective drawings may be different from counterparts in an actual device.

A manufacturing method of a semiconductor device according to an embodiment will now be described with reference to FIG. 1A to FIG. 3.

First, films F1 to F3 are sequentially formed on a processing target 100.

Although a type/material of the processing target 100 is not restricted in particular, it is possible to adopt as the processing target an ONON structure obtained by iteratively laminating an oxide film and a nitride film, an OPOP structure obtained by iteratively laminating an oxide film and a polysilicon film, an OMOM structure obtained by iteratively laminating an oxide film and a metal film, or the like. This embodiment will take an example where a surface is made of a material to which a plating film grows like amorphous silicon (aSi) or a silicon nitride film (SiN) having an unoxidized surface.

The film F1 and the film F3 are made of a material to which a plating film does not grow. As the material to which the plating film does not grow, a silicon oxide film ($SiO_2$) is used in this embodiment. The material to which a plating film does not grow is not restricted to the silicon oxide film ($SiO_2$) and, for example, a silicon nitride film (SiN) having an oxidized surface may be used. In this embodiment, the film F1 and the film F3 correspond to, e.g., third and second films, respectively and the silicon oxide film ($SiO_2$) corresponds to, e.g., a second material.

A film F2 is made of a material to which a plating film grows. As the material to which the plating film grows, amorphous silicon (aSi) is used in this embodiment. However, the material of the film F2 is not restricted to amorphous silicon (aSi), and it is possible to use, e.g., not only carbon (C) or a silicon nitride film (SiN) having an unoxidized surface but also a metal such as titanium (Ti) or tungsten (W), an alloy containing such a metal, or carbide (see FIG. 2). In this embodiment, the film F2 corresponds to, e.g., a first film, and amorphous silicon (aSi) corresponds to, e.g., a first material.

Figure 1B:
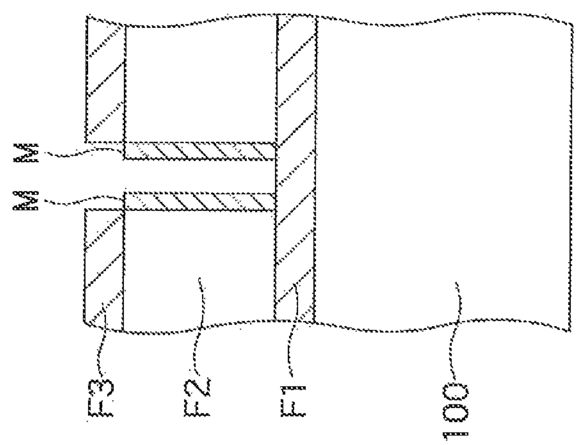
Figure 1A:
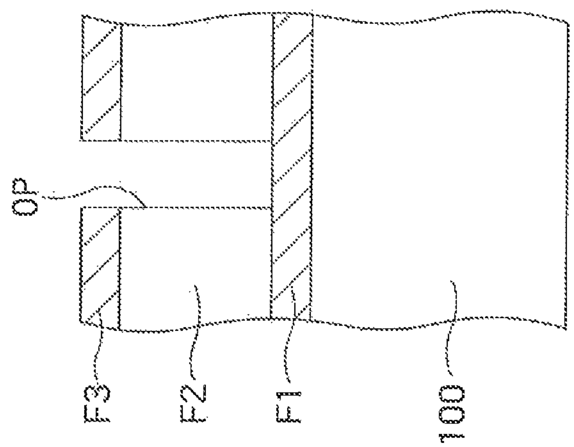

Then, the film F3 and the film F2 are selectively removed by using a known semiconductor microfabrication technology to form an opening or groove OP which is pierced in the film F3 and the film F3 and has a surface of the film F1 exposed on a bottom surface thereof as shown in FIG. 1A.

Subsequently, a plating film is grown on a surface of the film F2 alone by performing electroless plating. Consequently, as shown in FIG. 1B, a metal film M is formed only on a side surface of the opening or groove OP in the film F2. In this manner, a metal mask is formed by self-assembly.

A material having high etching resistance is selected as a metal species from electroless-platable materials, for example, palladium (Pd) is used in this embodiment, and a palladium chloride ($Cl_2$) solution is used as a catalyst. However, as will be described later, the material is not restricted to palladium (Pd) as a matter of course.

Then, a known etching process is performed by using the metal film M as a mask. As a result, as shown in FIG. 1C, a groove or hole pattern TR corresponding to a shape of the metal film M is formed in the processing target 100.

Although an etching loss of the film F2 is produced in a direction vertical to a surface of the processing target 100 by this etching process, since the metal film M is formed on the side surface of the opening or groove OP, it is possible to suppress the etching loss from the side surface of the opening or groove OP that seriously affects a shape of the groove pattern TR. As a result, the excellent shape can be obtained as compared with a case where an etching mask is formed by using a film made of, e.g., a material other than a metal.

Further, since the film F3 made of the material to which plating does not grow is formed on the film F2 made of the material to which plating grows, the metal film M is formed only on the side surface of the opening or groove OP without being formed on an upper surface of the film F2. Therefore, a coverage factor of the metal film M is greatly reduced as compared with a case where the film F3 is not formed.

After the etching process, a chemical treatment for removing processing residues is carried out. For example, the remaining metal mask can be removed together with the processing residues by a treatment using, e.g., a strong acid and a strong oxidizing agent such as a mixture of a sulfuric acid ($H_2SO_4$) and hydrogen peroxide ($H_2O_2$).

The electroless-platable material is not restricted to palladium (Pd), and it may be, e.g., copper (Cu) or nickel (Ni) that mostly has high mobility in silicon. If a chamber is contaminated with such a metal, such a metal diffuses to films or a substrate constituting a device by second scattering, and a risk that causes deterioration of electrical characteristics or deterioration of reliability of the device increases.

According to the manufacturing method of a semiconductor device in this embodiment, since a coverage factor of the metal film M is small with respect to a surface area of the processing target, an influence of scattering of a metal impurity to the etching chamber can be suppressed to the minimum level.

A combination of the film F1 to the film F3 is not restricted to the combination described above, and many combinations can be considered in accordance with electroless plating conditions, a pretreatment, and others.

In particular, to assure precipitation material selectivity for metal film growth (which will be simply referred to as "growth selectivity" hereinafter), it is preferable to perform a cleaning treatment before a catalytic treatment using a palladium chloride ($PdCl_2$) solution. Furthermore, as described above, silicon nitride film (SiN) growth selectivity differs depending on presence/absence of surface oxidation, and the growth selectivity can be modulated by using a pretreatment adopting an SAM (Self-assembled Monolayer) after the cleaning treatment and before the catalytic treatment.

This point will now be more specifically described with reference to FIG. 2. FIG. 2 shows an example of a table showing a relationship between plating conditions and plating growth results. As precipitation target materials for the metal film growth, a silicon oxide film ($SiO_2$), a silicon nitride film (SiN), amorphous silicon (aSi), and carbon (C) are used. A right-hand side of FIG. 2 shows results obtained when an RCA cleaning treatment provided by RCA was performed as a pretreatment and palladium (Pd) was imparted by using a palladium chloride ($PdCl_2$) solution.

In the case of each of amorphous silicon (aSi) and carbon (C), a metal film grows under all plating conditions shown in FIG. 2.

However, as to the silicon oxide film ($SiO_2$) and the silicon nitride film (SiN), the metal film may or may not grow depending on the plating conditions.

For example, when an SAM treatment is not performed, the metal film does not grow in case of both the silicon oxide film ($SiO_2$) and the silicon nitride film (SiN).

Here, when a trimethylsilyl-dimethylamine (which will be referred to as "TMSDMA" hereinafter) treatment is used, the metal film does not grown in regard to the silicon nitride film, but the metal film grows in regard to the silicon oxide film ($SiO_2$).

However, when the TMSDMA treatment is performed, a surface of the silicon oxide film ($SiO_2$) can be covered with a methyl group by a silane coupling reaction. On the other hand, the methyl group becomes sparse on the silicon nitride film (SiN) by this TMSDMA treatment.

Moreover, when a treatment is carried out by using aminopropyltrimethoxysilane after the TMSDMA treatment, an amino group is imparted to the silicon nitride film (SiN) that lacks the methyl group, but the amino group is not imparted to the surface of the silicon oxide film ($SiO_2$) ended with the methyl group in advance.

In a palladium (Pd) imparting process using the palladium chloride ($PdCl_2$) solution, palladium (Pd) atoms are not adsorbed by the methyl group, but they are adsorbed by the amino group alone. As a result, for example, there is a combination that allows selective growth of the plating film with respect to the silicon nitride film (SiN) but does not allow growth of the plating film with respect to the silicon oxide film ($SiO_2$).

In this embodiment, the plating film selectively grows with respect to the film F2 formed by using amorphous silicon (aSi), but the plating film does not grown with respect to the film F1 and the film F3 formed by using the silicon oxide film ($SiO_2$).

Thicknesses of the film F1 to the film F3 are determined in accordance with a combination of materials of these films and a material of the processing target and a processing depth of the processing target.

As regards the manufacturing method, the description has been given as to the mode of sequentially forming the film F1 to the film F3 on the processing target 100, the film F1 is not required when the surface of the processing target 100 is made of a material to which the plating film does not grow.

In the manufacturing method described above, from the viewpoint of the growth selectivity or a manufacturing cost, the electroless plating is used as the metal film forming method, but the method is not restricted thereto, and the same effect can be provided even when, e.g., a selective CVD (Chemical Vapor Deposition) method or organic molecules each containing a metal are used.

In the case of using the selective CVD method, it is good enough to form a film of tungsten (W) or nickel (Ni) by a method generally used in a semiconductor device wiring process, e.g., a dual damascene process. As a film forming gas, for example, tungsten hexafluoride ($WF_6$) can be used in tungsten (W) CVD. As regards a temperature, a pressure, a time, and others, a low temperature, a low pressure, and a short time are generally preferable.

As the organic molecule containing a metal, there are a metal nanoparticle covered with an organic molecular film as well as an organic molecule with structure in which a metal atom or a metal ion is trapped by the organic molecule. In any case, the growth selectivity can be dominated by a reaction group of the organic molecular film, and a metal species that turns to the metal film F can be individually selected in accordance with a type of the reaction group.

Figure 3:
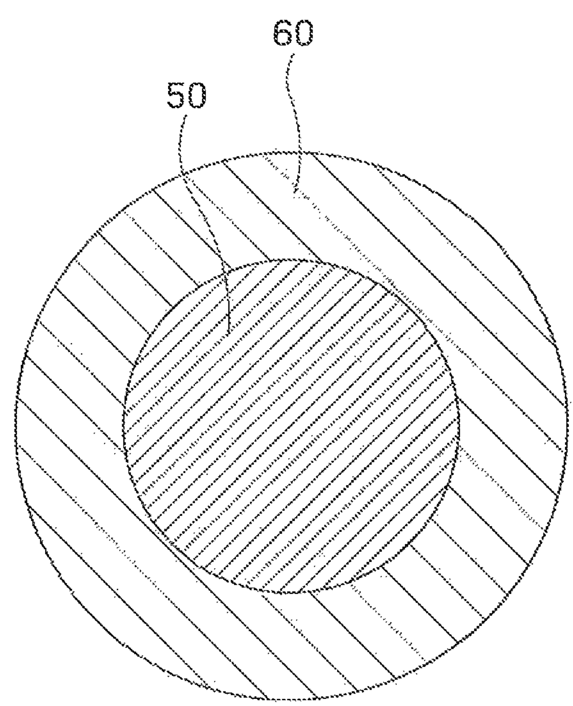
FIG. 3 is an example of a view for explaining a metal nanoparticle covered with an organic molecular film.

FIG. 3 shows an example of the organic molecule containing a metal. FIG. 3 shows an example of a metal nanoparticle 50 covered with an organic molecular film 60. In this embodiment, as a reaction group of the organic molecular film 60, there is, e.g., a thiol group that does not react with the film F1 or the film F3 that is the silicon oxide film ($SiO_2$), a phosphon group, or the like. It is to be noted that an organic molecular film whose end is a reaction group is also included as the organic molecular film 60.

A metal species of the nanoparticle 50 can be selected from various kinds that are present in the market, and it is not restricted to a material that can be deposited by the above-described plating method. Using the metal nanoparticle enables intending to achieve an ultrathin film of an organic monomolecular layer, and hence a thickness of the metal film F can be reduced. However, when the thickness is reduced too much, a function as a hard mask is lowered. A multilayer may be formed to adjust the thickness of the metal film F.

As an organic molecular that traps a metal atom or a metal ion, there is, e.g., porphyrin.

As a method for forming the metal film F by using the organic molecules each containing the metal, for example, an immersion method can be used. A solution having nanoparticies dispersed therein is discharged to a processing target, or the processing target is immersed in the solution having nanoparticles dispersed therein, and then rinsing and drying are performed, for example.

A type and a removal method of processing residues generated in the etching process using as a mask the metal film F made of organic molecules each containing the metal differ depending on a metal species of the nanoparticles.

When the metal species of the nanoparticles is, e.g., nickel (Ni) or cobalt (Co), removal is enabled by using a mixture of a sulfuric acid ($H_2SO_4$) and hydrogen peroxide ($H_2O_2$).

When the metal species of the nanoparticles is, e.g., tungsten (W) or molybdenum (Mb), it is preferable to use a mixture of ammonia ($NH_3$) and hydrogen peroxide water ($H_2O_2$).

It is to be noted that, since ruthenium (Ru), tantalum (Ta), and gold (Au) have insolubility, their delamination stage becomes difficult even though a special liquid such as aqua regia ($HNO_3$+3HCl) is used, and hence avoiding selection as the metal species is preferable under present circumstances.

According to at least one of the manufacturing methods of a semiconductor device described above, it is possible to create an etching mask having at least a surface made of a metal by self-assembly without performing a dry etching treatment with respect to a mask material with high etching resistance.

Further, according to at least one of the manufacturing methods of a semiconductor device described above, etching masks having various structures for various purposes can be created by using the patterning technology based on the semiconductor microfabrication and the growth selectivity.

Furthermore, according to at least one of the manufacturing methods of a semiconductor described above, a clean fine pattern can be obtained in the etching process for a fine and high-aspect pattern.

Although at least one of the manufacturing methods of a semiconductor device described above is not restricted to manufacture of a semiconductor device for a specific purpose and can be extensively used for manufacture of general semiconductor devices, it is particularly preferable when a pattern with a high aspect ratio must be etched with the use of a metal mask. As such semiconductor devices, there are semiconductor devices including, e.g., an NAND flash memory, a DRAM (Dynamic Random Access Memory), a BiCS (Bit Cost Scalable) flash memory, a PCRAM (Phase-Change Random Access Memory), a ReRAM (Resistive Random Access Memory), a TSV (Through Silicon Via), and others.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device comprising:

forming a first film on a processing target by using a first material;

forming a second film on the first film by using a second material;

selectively removing the second and first films to provide an opening pierced in the second and first films;

selectively forming a metal film on an inner surface of the opening in the first film by selective plating, where at least a part of an inner surface of the opening in the second film is not covered by the metal film; and processing the processing target by using the metal film as a mask, wherein the first material is a material to which metal atoms of the metal film precipitate, and the second material is a material to which the metal atoms of the metal film do not precipitate.

2. The method of claim 1, wherein the first material is carbon (C) or (Si), and the second material is a silicon oxide film (SiO2).

3. The method of claim 1, wherein the metal film is formed by electroless plating.

4. The method of claim 3, wherein the metal film is formed by subjecting palladium (Pd) to electroless plating.

5. The method of claim 1, wherein the processing target comprises a surface layer made of a material to which metal atoms of the metal film precipitate, and the method further comprises forming a third film between the processing target and the first film by using a material to which metal atoms of the metal film do not precipitate.

6. The method of claim 3, further comprising:

modulating growth selectively of a metal by a pretreatment using an SAM (Self-Assembled Monolayer) before forming the metal film.

7. The method of claim 1, wherein the metal film is formed by a selective CVD method.

8. The method of claim 1, wherein the metal film is formed by using organic molecules each containing a metal.

9. The method of claim 8, wherein the organic molecules each containing the metal are metal nanoparticles each of which is covered with an organic molecular film or organic molecules having a structure that each organic molecule traps a metal atom or a metal ion.

10. The method of claim 3, further comprising:

processing the first film and the second film material during the processing the processing target by using the metal film as a mask; and modulating growth selectivity of a metal by a pretreatment using an SAM (Self-Assembled Monolayer) before forming the metal film.

* * * * *